United States Patent
Zach

(10) Patent No.: US 9,366,713 B2
(45) Date of Patent: Jun. 14, 2016

(54) ARC FAULT DETECTION SYSTEM AND METHOD

(71) Applicant: Pentair Thermal Management, LLC, Menlo Park, CA (US)

(72) Inventor: Juergen J. Zach, Menlo Park, CA (US)

(73) Assignee: Pentair Thermal Management LLC, Menlo Park, CA (US)

( * ) Notice: Subject to any disclaimer, the term of this patent is extended or adjusted under 35 U.S.C. 154(b) by 324 days.

(21) Appl. No.: 13/901,404

(22) Filed: May 23, 2013

(65) Prior Publication Data

US 2014/0347066 A1 Nov. 27, 2014

(51) Int. Cl.
*G01R 31/02* (2006.01)
*G01R 31/12* (2006.01)

(52) U.S. Cl.
CPC .......... *G01R 31/024* (2013.01); *G01R 31/1272* (2013.01)

(58) Field of Classification Search
CPC .. G01R 31/12; G01R 31/025; G01R 31/2805; G01R 31/024; G01R 31/2812; G01R 31/2884; G01R 31/2853; G01R 31/09
USPC .............................. 324/522, 536, 537; 361/42
See application file for complete search history.

(56) References Cited

U.S. PATENT DOCUMENTS

| | | |
|---|---|---|
| 4,639,817 A | 1/1987 | Cooper et al. |
| 5,206,596 A | 4/1993 | Beihoff et al. |
| 5,307,230 A | 4/1994 | MacKenzie |
| 5,373,241 A | 12/1994 | Ham, Jr. et al. |
| 5,434,509 A | 7/1995 | Blades |
| 5,452,223 A | 9/1995 | Zuercher et al. |
| 5,477,150 A | 12/1995 | Ham, Jr. et al. |
| 5,682,101 A | 10/1997 | Brooks et al. |
| 5,729,145 A | 3/1998 | Blades |
| 5,835,321 A | 11/1998 | Elms et al. |
| 5,905,619 A | 5/1999 | Jha |
| 5,986,860 A | 11/1999 | Scott |
| 6,002,561 A | 12/1999 | Dougherty |
| 6,031,699 A | 2/2000 | Dollar, II et al. |
| 6,128,169 A | 10/2000 | Neiger et al. |
| 6,195,214 B1 | 2/2001 | Muray et al. |
| 6,259,996 B1 | 7/2001 | Haun et al. |

(Continued)

FOREIGN PATENT DOCUMENTS

WO  WO 2008069988 A2 * 6/2008 ............. G01R 31/12

*Primary Examiner* — Melissa Koval
*Assistant Examiner* — Felicia Farrow
(74) *Attorney, Agent, or Firm* — Quarles & Brady LLP

(57) ABSTRACT

Embodiments of the invention provide systems and methods for detecting a sustained arc in an electrical system containing polymer-based, semi-conducting components which derive their conductivity from carbon black, carbon nanotubes or other conductive materials. Over a time period, current and voltage data for a cable signal are collected, from which spectral information is extracted. The spectral information has a frequency component and an amplitude component. The cable signal is processed to remove a line frequency signature that includes the electrical system's line current frequency and its harmonics. One or more off-harmonic frequency bands are extracted from the cable signal and analyzed to determine the presence of an arc signature therein. Analysis of the off-harmonic frequency bands can include applying a matched filter to the off-harmonic frequency bands to obtain an indicator signal and determining if the indicator signal exceeds a threshold that indicates the presence of the sustained arc.

19 Claims, 8 Drawing Sheets

(56) References Cited

U.S. PATENT DOCUMENTS

| | | | |
|---|---|---|---|
| 6,362,628 B2 | 3/2002 | MacBeth et al. |
| 6,373,257 B1 | 4/2002 | MacBeth et al. |
| 6,400,258 B1 | 6/2002 | Parker |
| 6,407,893 B1 | 6/2002 | Neiger et al. |
| 6,459,273 B1 | 10/2002 | Dollar, II et al. |
| 6,532,140 B1 | 3/2003 | McMahon et al. |
| 6,567,250 B1 | 5/2003 | Haun et al. |
| 6,625,550 B1 | 9/2003 | Scott et al. |
| 6,751,528 B1 | 6/2004 | Dougherty |
| 6,859,042 B2 | 2/2005 | Parker |
| 7,035,066 B2 | 4/2006 | McMahon et al. |
| 7,038,897 B2 | 5/2006 | Csanky et al. |
| 7,062,388 B2 | 6/2006 | Rivers et al. |
| 7,068,480 B2 | 6/2006 | Wong et al. |
| 7,136,265 B2 | 11/2006 | Wong et al. |
| 7,190,561 B2 | 3/2007 | Pellon et al. |
| 7,190,562 B2 | 3/2007 | Pellon et al. |
| 7,227,729 B2 | 6/2007 | Parker et al. |
| 7,307,820 B2 | 12/2007 | Henson et al. |
| 7,319,754 B2 | 1/2008 | Petitjean |
| 7,359,168 B2 | 4/2008 | Elms et al. |
| 7,368,918 B2 | 5/2008 | Henson et al. |
| 7,391,218 B2 | 6/2008 | Kojori et al. |
| 7,400,481 B2 | 7/2008 | Pellon et al. |
| 7,441,173 B2 | 10/2008 | Restrepo et al. |
| 7,463,037 B2 | 12/2008 | Henson et al. |
| 7,489,138 B2 | 2/2009 | Yu et al. |
| 7,492,163 B2 | 2/2009 | Restrepo et al. |
| 7,518,839 B2 | 4/2009 | Chou et al. |
| 7,633,727 B2 | 12/2009 | Zhou et al. |
| 7,633,728 B2 | 12/2009 | Parker et al. |
| 7,633,729 B2 | 12/2009 | Oldenburg et al. |
| 7,796,366 B2 | 9/2010 | Kilroy et al. |
| 7,834,637 B2 | 11/2010 | Kojori et al. |
| 7,864,492 B2 | 1/2011 | Restrepo et al. |
| 7,898,781 B2 | 3/2011 | Kawate et al. |
| 8,054,591 B2 | 11/2011 | Changali et al. |
| 2006/0018060 A1 | 1/2006 | Elms et al. |
| 2009/0168277 A1 | 7/2009 | Changali et al. |
| 2012/0098672 A1* | 4/2012 | Restrepo et al. ............... 361/42 |
| 2014/0347065 A1* | 11/2014 | Zach ............................ 324/537 |

\* cited by examiner

ARC FAULT DETECTION SYSTEM AND METHOD

BACKGROUND

Arcing in electrical systems is a well-known but unwanted phenomenon, typically resulting from either poor installation procedures for system components, or breakdown of conductors or insulators in the system, creating an arc pathway between two conductors or to ground. Arcs may damage electrical system components immediately or over time and may cause potentially detrimental circuit breaks. If an arc has sufficient current and voltage, it may become a sustained arc that is either substantially constant or recurs at regular or irregular intervals. A sustained arc is desirable for applications such as welding, but in other applications an unwanted sustained arc can melt, corrode, or otherwise damage system components, and can reduce the overall performance of the system. In some electrical systems, a sustained arc may be produced at very small current levels.

Self-regulating electrical systems can be susceptible to this phenomenon. Such electrical systems can contain polymer-based, semi-conducting components which derive their conductivity from the addition of carbon black, carbon nanotubes or other conductive materials. In particular, self-regulating heating cables used in trace heating applications can be susceptible to this phenomenon when improperly installed or damaged. In such a cable, parallel current-carrying bus wires are normally spaced apart from each other. In solid core heating cables, the bus wires are separated by a semi-conductive, substantially solid polymer heating element. In fiber heating cables, the bus wires are insulated from each other by a non-conductive spacer, and a semi-conductive fiber heating element is wrapped helically around the bus wires. The heating cable does not exhibit arc faults under normal conditions. However, if the cable is installed improperly or damaged, the bus wires may become partially exposed and a sustained arc may be created between those exposed wires if they are exposed to water and energized. For example, if the cable is installed in a wet area, the exposed bus wires may contact or be submerged in water. Depending on the specific circumstances, the water can initiate a sustained arc that is not able to trip a circuit protection device, but nevertheless may destroy the heating element and release conductive particles. These particles can exacerbate the arcing and do other damage.

Electrical systems often employ circuit protection devices, including arc detectors that place the system in a "fault" condition, such as by tripping a circuit breaker or initiating an alarm when the detector detects an arc that exceeds a certain threshold or contacts a certain component. Conventional circuit breakers are designed to protect electrical circuits by detecting overloads and short circuits. The amount of current transferred in these situations is high, so these devices have a low sensitivity to current variations and thereby avoid false alarms that would break the circuit without need. In contrast, a residual-current device ("RCD") is configured to disconnect an electrical circuit when the device detects an excessive imbalance in system current that can be caused by arcing transfer of current to a conductor that normally does not carry system current. RCDs, including ground fault interrupters ("GFIs"), earth leakage circuit breakers "ELCBs", safety switches, and trip switches, are configured with a much lower sensitivity than a conventional circuit breaker and are able to detect arc-induced erratic circuit behavior that does not trip a breaker. At such a low sensitivity, the RCD must be further configured to differentiate between an arc-induced current variation and one caused by normal circuit operation, such as the actuation of a switch, the activation or deactivation of a motor, or the sudden removal of a load by unplugging or other means, in the electrical system. This adds cost and complexity to RCDs, and false positive circuit interruption remains a major drawback for existing RCDs. Yet a third type of device, an arc fault circuit interrupter ("AFCI"), may detect variations in the current in both frequency and time which are not characteristic of any regular electrical loads. However, while they can be more sensitive than some RCDs and can also detect arcs between load and neutral terminals not involving ground, experimental tests have shown that AFCIs are still not sufficiently sensitive to detect a sustained arc in commercial self-regulating heating cables.

In particular, attempts to deploy known commercial AFCIs to detect sustained bus-to-bus arc faults as well as ground faults and other arc faults in electric heat tracing systems, including self-regulating polymer-based heating cables, have failed.

SUMMARY

Some embodiments of the invention provide a method of detecting a sustained arc in an electric heat tracing system. The method includes collecting, over a predetermined time period, electrical voltage and current data for a cable signal, by employing appropriate sensors such as shunt or sensing resistors, induction coils or Hall effect sensors. The sensors can be sampled in a time domain with a rate of 1 kHz or greater, and typically 4-100 kHz. These data are then analyzed for spectral information of the cable signal. The spectral information can be extracted from the sampling of the line signal and can comprise a frequency component and an amplitude component. The method can further include removing a line frequency signature from the spectral information, the line frequency signature comprising the electrical system's line current frequency and one or more harmonics of the line current frequency. The method can further include extracting one or more off-harmonic frequency bands from the spectral information; and analyzing the off-harmonic frequency bands to determine the presence of an arc signature.

Some embodiments of the invention provide a method of detecting a sustained arc in a self-regulating electrical system of a particular type, such as a self-regulating heating cable, wherein off-harmonic frequency bands are compared to short-term historical values of arcing signatures in that type of electrical system, the short term being on the order of several seconds to several minutes. Other embodiments of the invention provide a method of detecting a sustained arc in a self-regulating electrical system of a particular type, such as a self-regulating heating cable, wherein off-harmonic frequency bands are compared to long-term historical values of arcing signatures in that type of electrical system, the long term being on the order of several days to several months.

DETAILED DESCRIPTION

Figure 1:
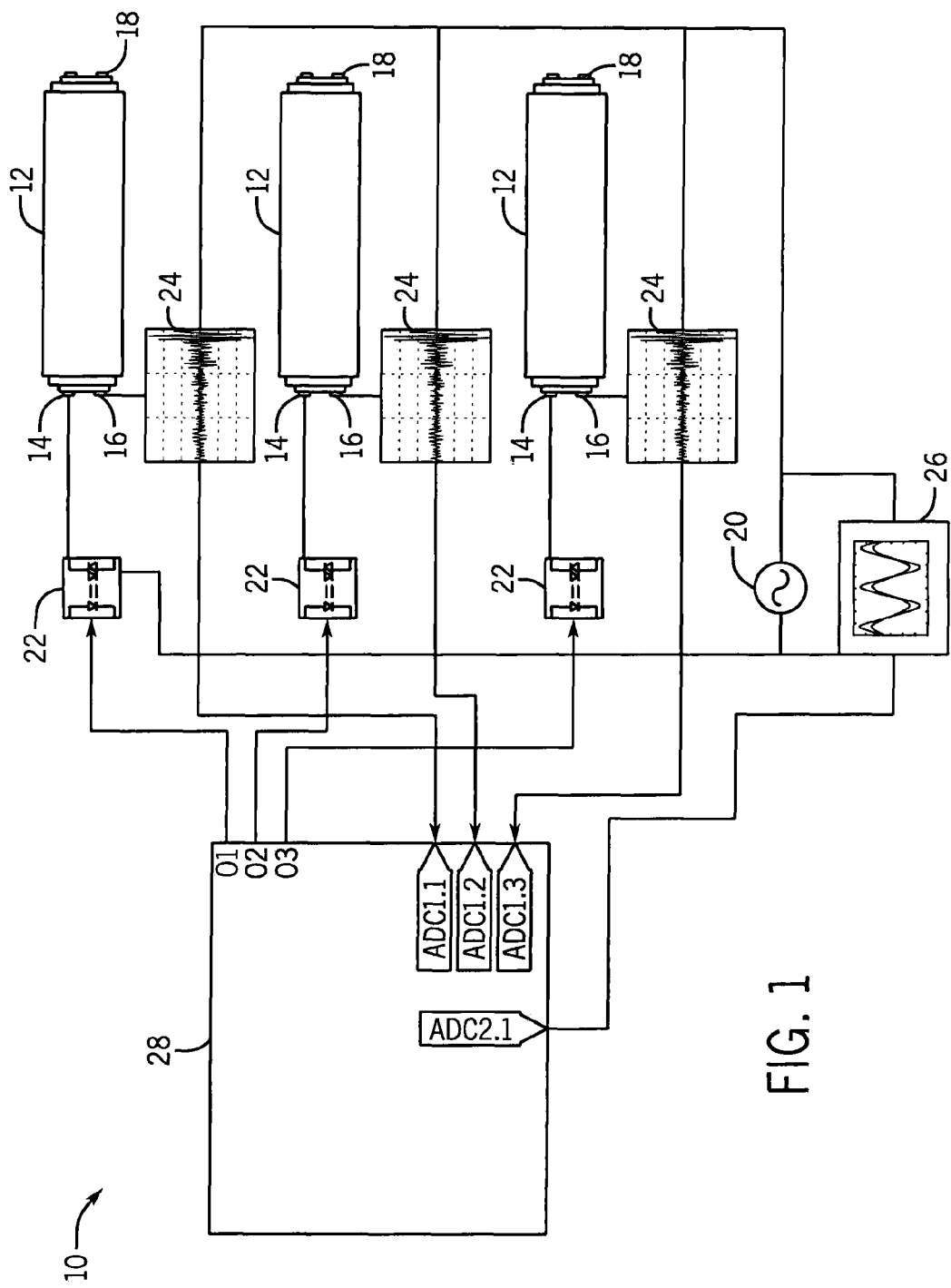
FIG. 1 is a schematic diagram of a system for detecting sustained arc faults in heating cables according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

FIG. 1 illustrates a sustained arc monitoring system 10 according to one embodiment of the invention. The system 10 can include monitoring and reporting arrangements for one or more circuits, each circuit including a heating cable 12. The heating cable 12 can be a heating cable used in trace heating systems, and can be between less than one meter and more than 200 meters long. Suitable heating cables 12 include, without limitation, zone cables, self-regulating cables, other cables that have parallel bus wires 14, 16 for conducting current, and still other heating cables having one or more current-carrying wires that can become susceptible to sustained arcing. In one implementation, the heating cable 12 is a solid-core self-regulating heating cable, having a semiconductive polymer heating element 18 that substantially encases the bus wires 14, 16. The bus wires 14, 16 can be attached to opposite terminals of an alternating current power supply 20. The power supply 20 provides the electrical current, referred to herein as the line current, for all circuits. The line current may be produced at any suitable alternating current frequency, referred to herein as the line frequency. Typically, the line frequency is 50 Hz or 60 Hz, as provided by mains power, but the line frequency may deviate significantly from its expected frequency due to characteristics of components in the electrical system. With reference to the figures, the line frequency is described herein at 60 Hz, but it will be understood that the described systems and methods can be used with any line frequency or deviated line frequency.

A circuit interrupter 22, such as a TRIAC, can be disposed between the first bus wire 14 and the power supply 20. A circuit monitor 24 can be disposed between the second bus wire 16 and the power supply 20. The circuit monitor can contain current probes such as shunt resistors, Hall effect probes, induction coils or transformers, as well as subsequent conditioning electronics. An input voltage monitor 26 can be disposed in electrical communication with the power supply 20. The voltage monitor can be comprised of a sensing resistor or any other voltage meter and subsequent conditioning electronics. A control unit 28 can be configured to receive input from one or more of the circuit monitors 24 and the input voltage monitor 26. The control unit 28 can be a microcontroller, a digital signal processor, or another control device or array of control devices having suitable capacity for the desired system 10 implementation. The control unit 28 can be configured to perform one or more of the sustained arc detection methods described herein, based on the input from the circuit monitors 24 and input voltage monitor 26. The control unit 28 can be in electrical communication with the circuit interrupters 22 in order to instruct a circuit interrupter 22 to interrupt the current if analysis of the corresponding circuit monitor's 24 input indicates that a sustained arc is present.

The system 10 can be configured to collect current and voltage measurements in the time-domain with an acquisition rate of at least 1 kHz, but typically between 4-100 kHz. The system 10 can extract from the collected data spectral information regarding the frequency and amplitude of the line current supplied to the heating cable 12. The input voltage monitor 26 can collect line current data by being connected to the circuit across the power supply 20. This data stream is referred to herein as the "input signal" to the heating cable 12 and can contain one or more voltage measurements, as well as spectral information comprising frequency and amplitude components, for discrete time segments during which the data stream is collected. The input voltage monitor 26 can transmit the input signal to the control unit 28 for processing. The input signal can provide an independent measurement of the line frequency and its integer harmonics as well as their amplitudes to be used in extracting information on arcing signatures from the cable signal. The input signal can also provide a veto for anomalous input frequency, amplitude and phase fluctuations to cause false alarms in the cable signal. Fluctuations which are strong enough to cause such a false trigger are rare and not anticipated during normal operation in environments where heating cables are deployed, but they are possible. Empirical measurements can be conducted which calibrate the thresholds of line frequency and amplitude fluctuations which would lead to a false positive, and these measurements can be used in the veto. The circuit monitor 24 can collect a data stream for the line current as it is affected by the heating cable 12. This data stream is referred to herein as the "cable signal" and can contain one or more current measurements, as well as spectral information comprising frequency and amplitude components, for discrete time segments during which the data stream is collected. The circuit monitor 24 can transmit the cable signal to the control unit 28 for processing.

While the above circuits and the below methods are described with reference to self-regulating heating cables, the circuits and methods can be implemented for any self-regulating electrical system containing polymer-based, semi-conducting components which derive their conductivity from the addition of carbon black, carbon nanotubes or other conductive materials. Such self-regulating electrical systems are implemented according to the principles described with respect to the heating cable 12, and therefore can benefit from the described arc detection methods.

Figure 2:
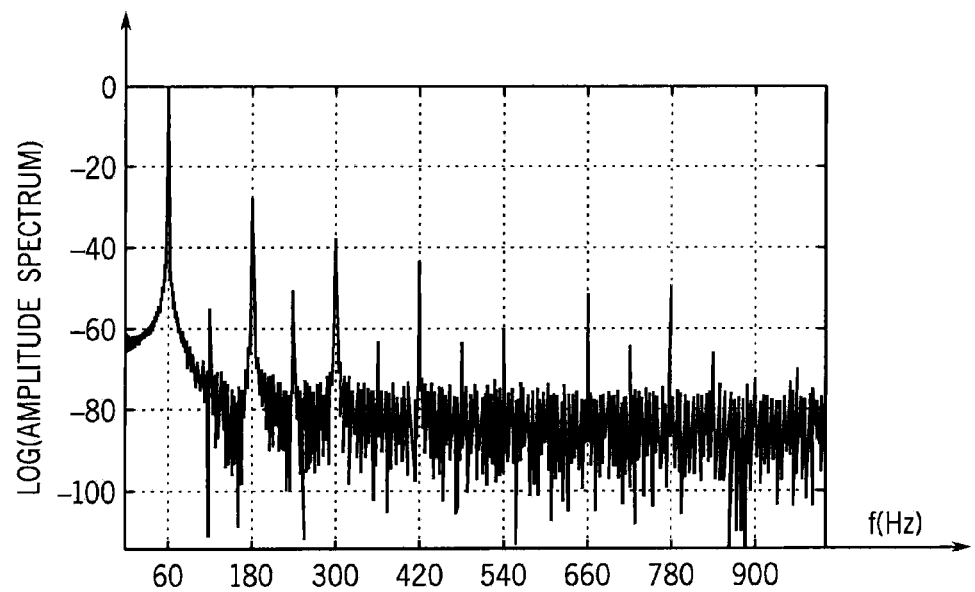
FIG. 2 is a diagram of an example current frequency spectrum for a heating cable having no sustained arcs.

The heating cable 12 is an intrinsically noisy environment that results in electrical losses due to the conversion, by design, of some of the line current into thermal energy. Additionally, the heating cable 12 can have a nonlinear impedance-voltage relationship, which generates strong harmonic components of the line frequency. FIG. 2 illustrates an example of the cable signal's spectral information, in which a relatively flat baseline noise level is punctuated by amplitude peaks which, besides the dominant line current frequency, include odd harmonic components which are much stronger than in a standard load. As an illustration, in FIG. 2 the line frequency is about 60 Hz and harmonic peaks occur at all frequencies which are an integer number times the base frequency, whereas the odd harmonics, 180 Hz, 300 Hz, 420 Hz, and so on, dominate. For the present example, these harmonics are visible up to about 1 kHz, but that upper limiting frequency depends on the integration window for the Fourier transform and might be higher in some implementations. The upper limiting frequency can be at least several times the line frequency.

Figure 3:
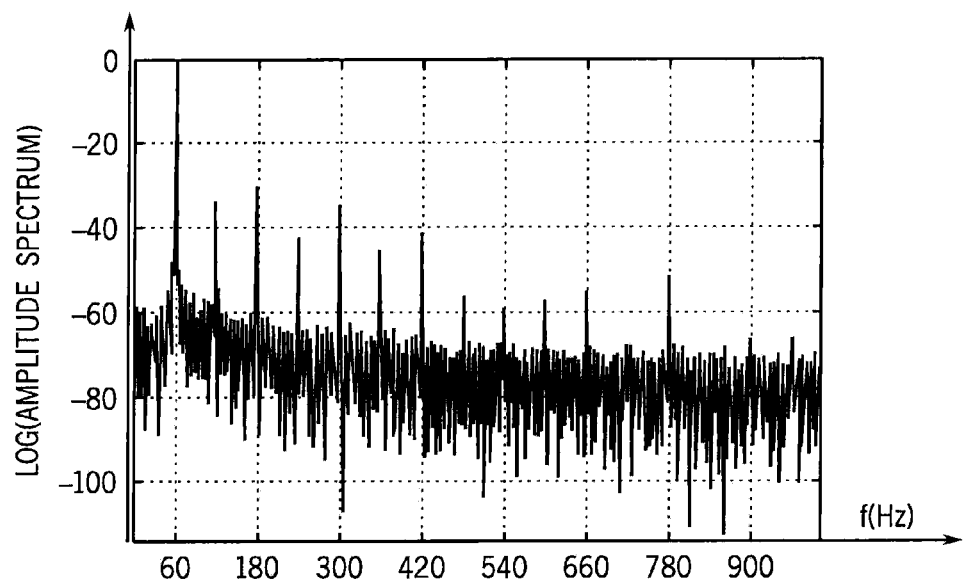
FIG. 3 is a diagram of an example current frequency spectrum for a heating cable having sustained arcs.

FIG. 2 represents the amplitude spectrum of the baseline cable signal that is generated by a normally functioning heating cable 12. That is, the heating cable 12 monitored in FIG. 2 does not have any sustained arcs. The baseline cable signal for the heating cable 12 can be obtained directly from the heating cable 12, such as by collecting the data and deriving spectral information from the data as described herein in the field over the course of a baseline time scale, which may be as short as a few seconds in advance of an arcing event, or as long as one day, several days, or even weeks in order to determine the progressive development of arcing signatures. Alternatively, the baseline cable signal can be obtained through laboratory testing of the heating cable 12 itself, or a representative sample thereof, in advance of applying the detection methods herein to the heating cable 12 in the field. In contrast to FIG. 2, FIG. 3 illustrates an example of the cable signal's spectral information when a sustained arc is present. The cable signal appears to have a generally higher amount of noise than the baseline cable signal of FIG. 2. However, some or all of the additional amplitude in the cable signal can be contributed by the sustained arc, and a signature of the arc may be detectable therein.

Figure 4:
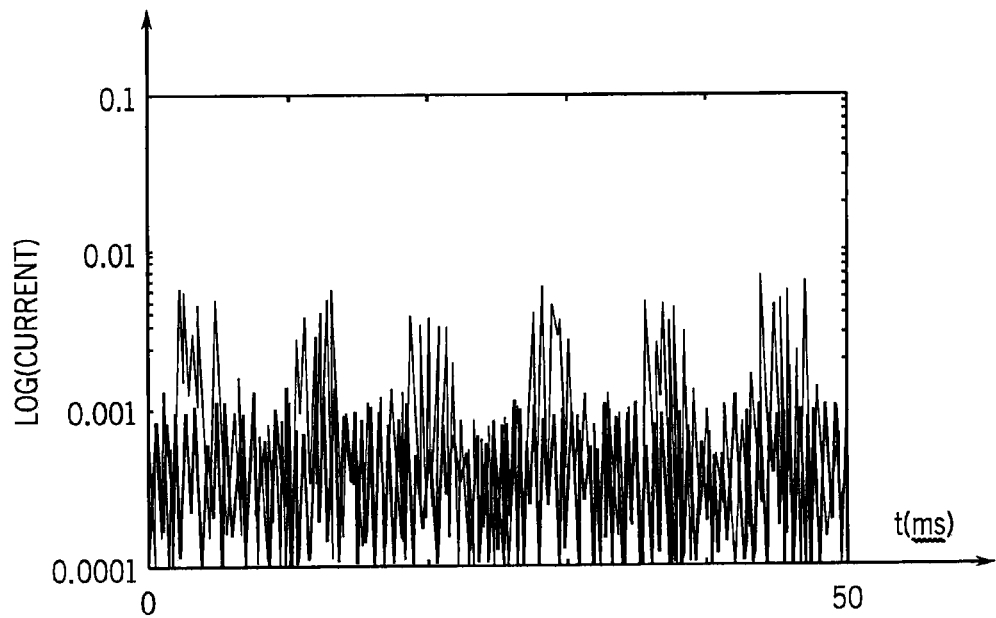
FIG. 4 is a diagram of an example time-segmented off-harmonic frequency band spectrum.

Due to the typical amplitudes of sustained arcs being a small fraction of the amplitude of the line current and the line current harmonics, the effect of arcing on the line current harmonics, a commonly used signature for present commercial arc detection, is negligible. On the other hand, the sustained arcs can appear as a distinct signal with a much different time domain characteristic than the background noise. FIG. 4 illustrates this via an expanded, comparative view of the amplitude variation within a frequency range between two line current harmonics over a time duration of about three times the fundamental period of 17 ms. A frequency range between two line current harmonics is referred to generally herein as an "off-harmonic frequency band." The off-harmonic frequency band can have a discrete, measurable range. For example, for a line frequency of 60 Hz, an off-harmonic frequency band can comprise frequencies between 61 Hz and 119 Hz, or 65 Hz and 115 Hz, or 70 Hz and 110 Hz, and so on, provided the range of frequencies does not include the amplitude peaks contributed by the line current. As shown in FIG. 4, the amplitude 40 of the arcing cable signal peaks with each discharge of the sustained arc, and can be modulated with a periodicity which is synchronous to the line frequency. In contrast, the amplitude 42 of the baseline cable signal remains at the baseline noise level for this time domain.

In some embodiments of the invention, the arc signal can be detected within one or more off-harmonic frequency bands, and strong fluctuations in the line voltage can be monitored to eliminate false positives. Thus, monitoring of the line frequency and its harmonics can be limited to only the extent necessary to veto input voltage fluctuations. The line current can be monitored, before and after passing through the heating cable 12, with a sampling frequency that is at least twice the maximum frequency to be analyzed, considering that a sampling frequency greater than the highest frequency of interest by an order of magnitude improves the quality of sampling. A sampling rate of 10 kHz is an adequate conservative value, but reasonable ranges are between 4-100 kHz. The time segments over which the collected spectral information is analyzed can be large enough to be statistically relevant, yet smaller than the thermal equilibrium timescales of the heating cable. For example, the time segments can be 0.5-2 seconds. In one embodiment, to warn against rapidly evolving arcs, the arcing signatures can be compared against a baseline reading over seconds or minutes prior to the present. In another embodiment, the baseline can be obtained from a longer-term deployment history, such as over weeks, months, or a year, of the heating cable 12, or from values determined in laboratory testing of a specific heating cable type.

Figure 5:
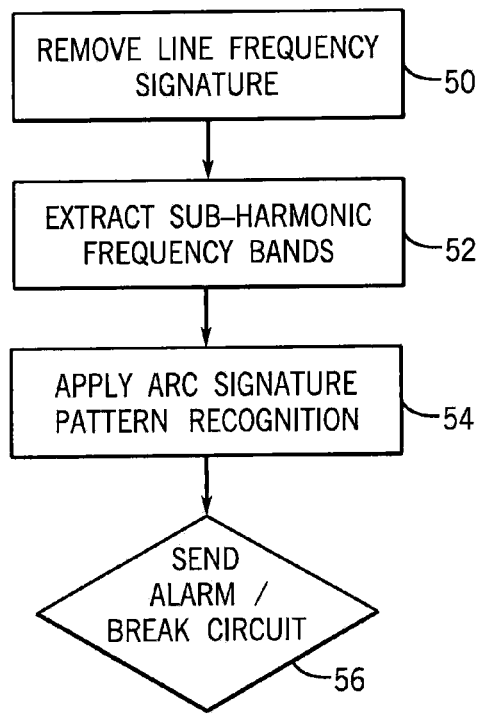
FIG. 5 is a flowchart showing a method of detecting sustained arcing in a heating cable.

The detection methods described herein can be performed by a control unit or by any suitable computing unit or group of computing units. In some embodiments, some steps of the detection methods can be performed in the field, while others are performed in a laboratory or other data analysis location remote from the location of the heating cable 12. For example, the spectral information can be collected by a data logger placed in communication with the heating cable 12, and the data logger can transmit the collected data through a wired or wireless connection to high-performance personal computer or a mainframe. FIG. 5 illustrates one embodiment of a method for detecting sustained arcing by analyzing the spectral information of the cable signal. At step 50, the control unit removes the line frequency signature from the spectral information of the cable signal. The line frequency signature includes the base line frequency and its harmonic frequencies up to the highest frequency of interest, typically about 1 kHz. Removal of the line frequency signature allows for the use of computationally efficient bandpass filters in subsequent steps. In particular, at step 52, the microcontroller can use the efficient bandpass filters to extract a situationally appropriate number of off-harmonic frequency bands from the cable signal. The number of frequency bands needed can depend on the detection being performed: a small number of frequency bands may suffice for detecting whether a sustained arc is present in a longer heating cable, since higher frequency bands are much more attenuated, which leads to possibly lowered sensitivity. In shorter heating cables, more frequency bands are available. Each frequency band can be extracted over a predetermined time period, and the extracted information can be further divided into time segments. At step 54, the microcontroller can apply arc signature pattern recognition processes to the time segments of the extracted frequency bands. Pattern recognition can include the application of a matched filter to enhance the arc signature, if present, as further described below. If the pattern recognition indicates the presence of an arc, at step 56, the microcontroller can send an alert, interrupt the circuit, or both.

Figure 6:
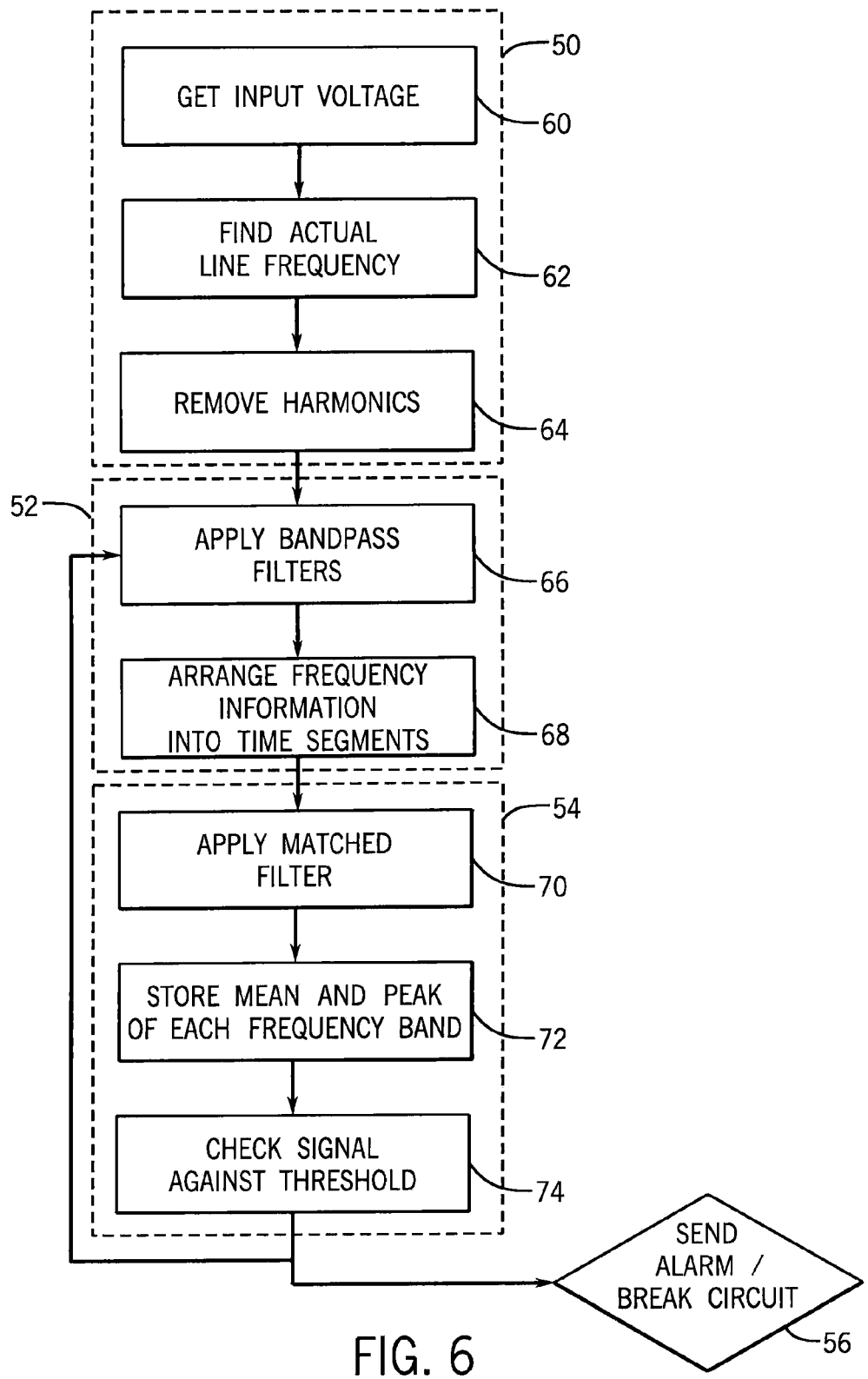
FIG. 6 is a flowchart showing another method of detecting sustained arcing in a heating cable.

FIG. 6 illustrates an implementation of the method of FIG. 5. Removing the line frequency signature from the spectral information of the cable signal can include, at step 60, obtaining the input signal. The input signal can be obtained from the power supply 20 or from the heating cable 12. The input signal includes frequency and amplitude components of the line current. The line frequency is either 50 Hz or 60 Hz depending on jurisdiction, but fluctuations in the current may continuously shift the line frequency by up to 5 Hz or more away from the theoretical frequency, particularly if the power supply is from a local source such as a generator. In order to accurately remove the line frequency signature, at step 62, the control unit can determine the actual, real-time line frequency. The microcontroller can perform adaptive notch filtering of the input signal to identify the period of the line signal. An adaptive notch filter implemented in one embodiment applies a filtering algorithm that matches the input signal function V(t) to the harmonic functions y(t), φ(t):

$$\phi(t)=\omega(t)t+\delta(t)$$

$$y(t)=A(t)\sin(\phi(t))$$

by minimizing the differential e(t) between the input signal function V(t) and the function y(t), whereas the result e(t) is the part of the signal which might contain arcing signatures:

$$e(t)=|V(t)-y(t)|$$

The control unit can recalculate and minimize e(t) continuously or at regular intervals in order to track the line frequency ω, amplitude A and phase φ. As a consequence of the removal of the base frequency, subsequent harmonics are also removed from the signal by minimizing the residual $e_n(t)$ for each harmonic term n. Minimization of the error can eliminate or suppress over-matching of the harmonics, so that only harmonics that are in phase with the line frequency are removed in the next step.

At step 64, the control unit can remove the line frequency signature from the cable signal, including the actual line frequency $f_0$ and its harmonics $Nf_0$, where N is an integer that multiplies the line frequency up to the highest frequency of interest.

Figure 7:
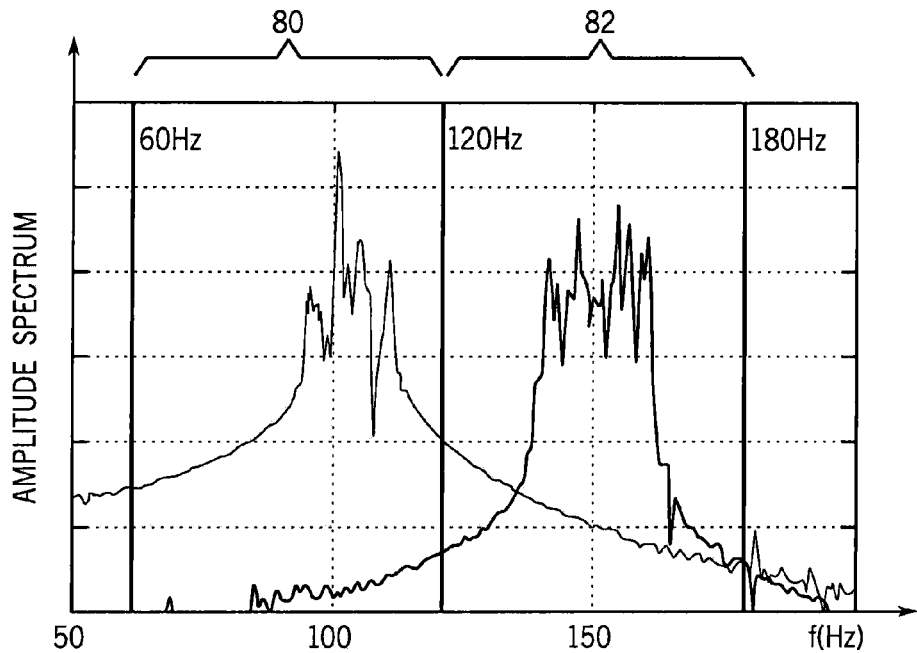
FIG. 7 is a diagram of example filtered off-harmonic frequency bands in a heating cable having no sustained arcs.
Figure 8:
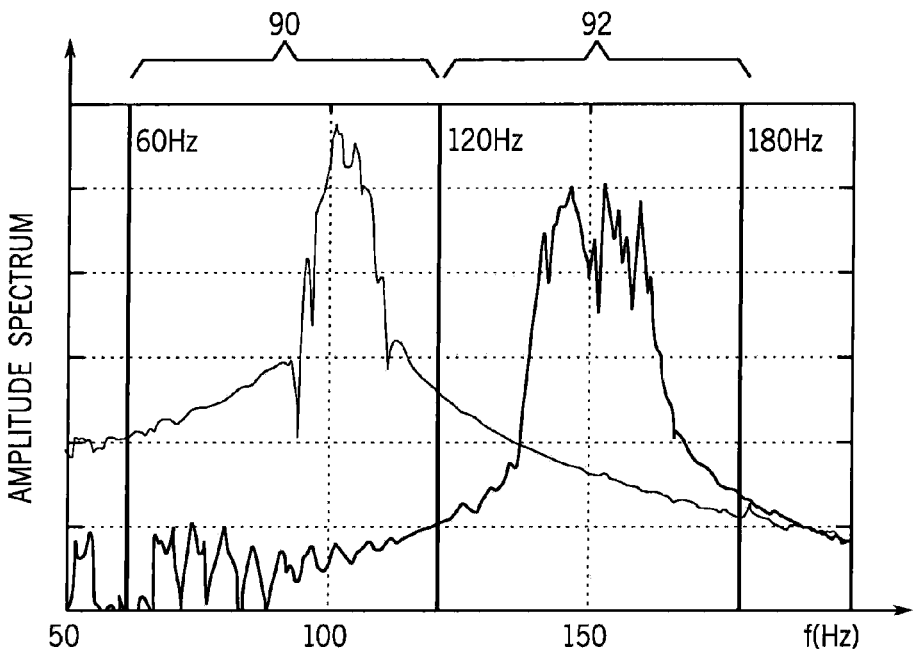
FIG. 8 is a diagram of example filtered off-harmonic frequency bands in a heating cable having sustained arcs.

Extracting the off-harmonic frequency bands can include, at step 66, applying one or more bandpass filters to obtain the desired frequency bands. Due to the notched removal of the line frequency signature peaks, suitable bandpass filters can include computationally efficient filters, such as real-time, recursive, elliptic-notch filters capable of extracting about 30 bands up to about 1.2 kHz. A suitable filter profile can provide about 40 dB of rejection, or better, at a suitable width around the center frequency of the frequency band. Such a profile passes through a selection of frequencies that is likely to include arc signatures and exclude any remnant of the line frequency signature. The pass-band can include a signal ripple to minimize error in the filter. FIG. 7 illustrates an example of the extraction and filtering of two off-harmonic frequency bands 80, 82, which are 60-120 Hz and 120-180 Hz non-inclusive, of the base cable signal. The amplitudes of the pass-band frequencies reflect the baseline noise level. FIG. 8 illustrates extraction and filtering of the same two frequency bands 90, 92 in an arcing cable signal. The amplitudes of the pass-band frequencies reflect the baseline noise level with peaks contributed by the arc signature's frequency.

Figure 9:
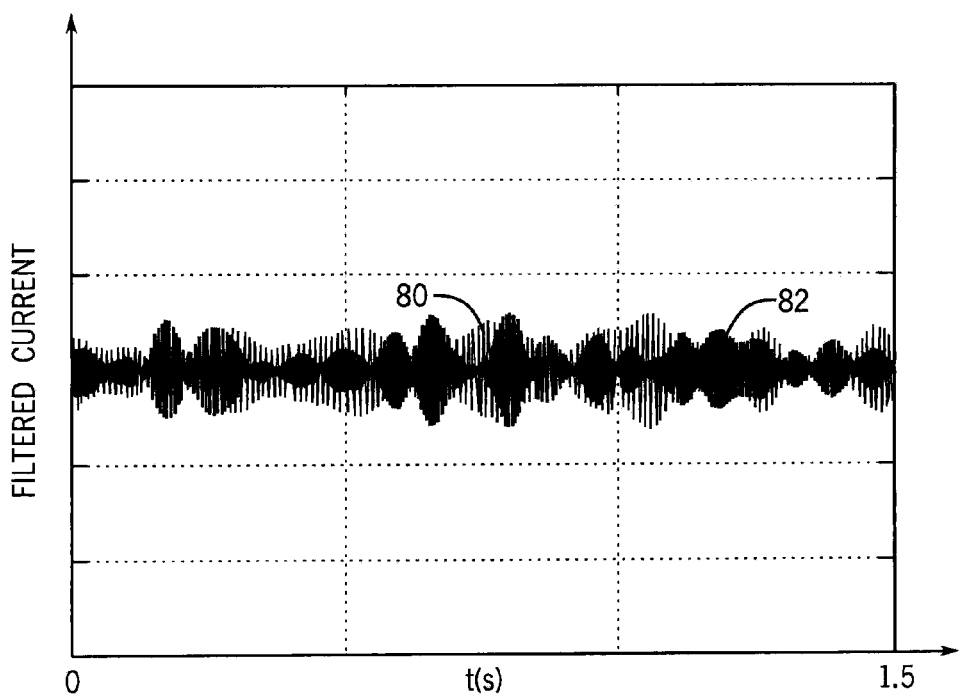
FIG. 9 is a diagram of an example time-segmented, filtered, off-harmonic frequency band response in a heating cable having no sustained arcs.
Figure 10:
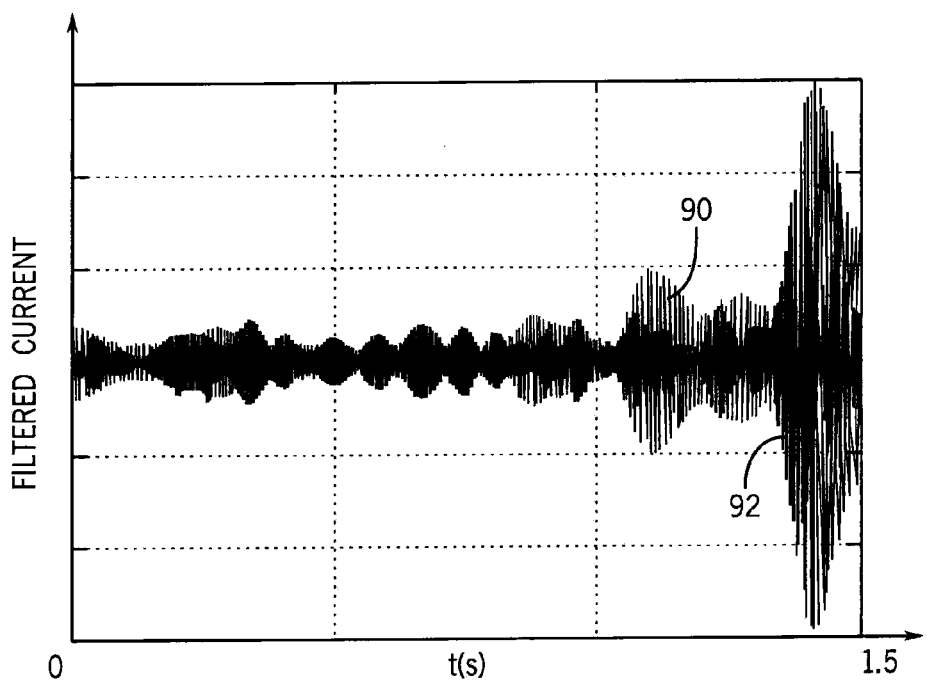
FIG. 10 is a diagram of an example time-segmented, filtered, off-harmonic frequency band response in a heating cable having sustained arcs.

Referring again to FIG. 6, at step 68, the filtered cable signal can be divided into time segments. The time segments are large compared to one line cycle, but small compared to typical time scales in which an arc could trigger a fault condition. Suitable time segments have been determined to be in the range from about 0.5-3 seconds, and more particularly about 1-2 seconds. In order to avoid time boundary effects and possibly lose information, two data streams can be concurrently analyzed with time segment boundaries shifted by at most one half of a time segment. For example, FIGS. 9 and 10 illustrate the frequency bands of FIGS. 7 and 8 in a 1.5-second time segment. FIG. 9 illustrates the frequency bands 80, 82 recorded from the base cable signal for 1.5 seconds. The frequency bands 80, 82 remain at a substantially similar and relatively stable amplitude. In contrast, FIG. 10 illustrates the frequency bands 90, 92 recorded from the arcing cable signal for 1.5 seconds. For about the final 0.5 seconds of the time segment, the amplitudes of both frequency bands 90, 92 peak drastically. These peaks indicate a current variation caused by a sustained arc.

Figure 11:
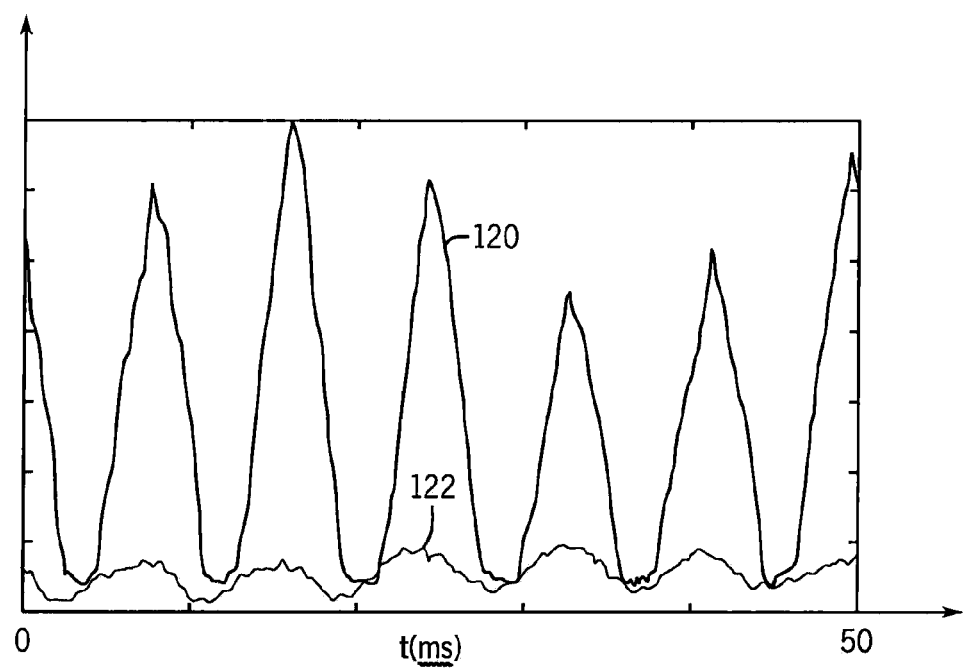
FIG. 11 is a diagram of an example matched filter attribute range derived from applying a matched filter to the diagram of FIG. 4.
Figure 12:
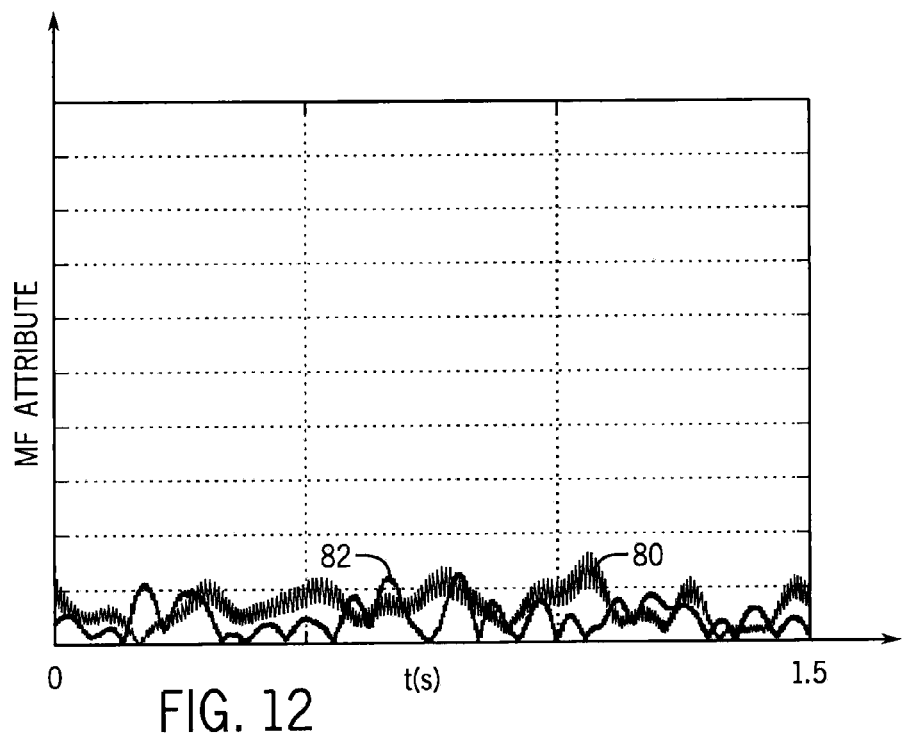
FIG. 12 is a diagram of an example matched filter attribute range derived from applying a matched filter to the diagram of FIG. 10.
Figure 13:
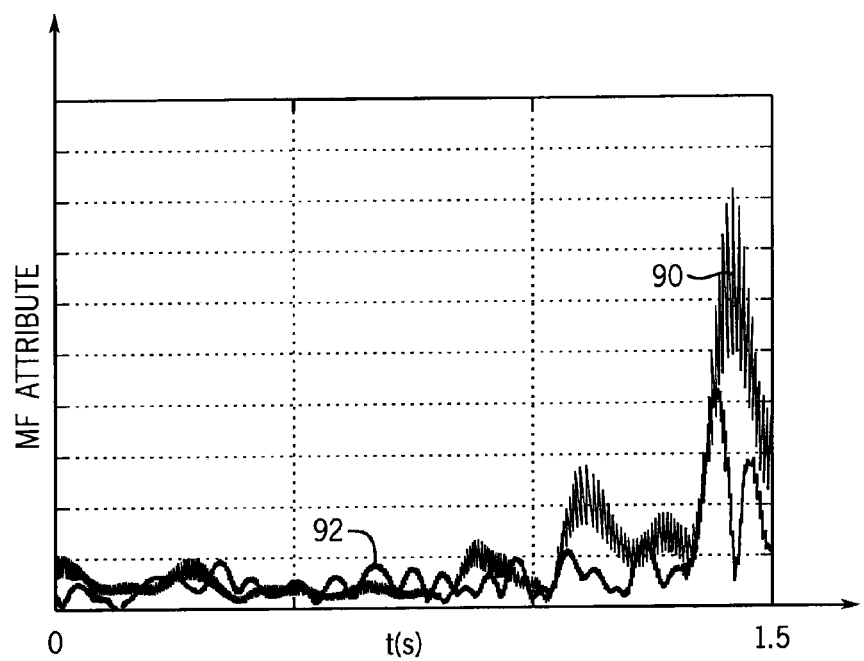
FIG. 13 is a diagram of an example matched filter attribute range derived from applying a matched filter to the diagram of FIG. 11.

For sufficiently short heating cables, such as about 12 meters or less, the arc signal may dominate the filtered cable signal to a degree that allows the arc signal to be identified immediately after filtering without applying pattern matching filters. In one such embodiment, the microcontroller can send an alert, break the circuit, or both, if the amplitude of the filtered cable signal exceeds a certain threshold. In longer heating cables, more complex pattern matching may be needed. Referring again to FIG. 6, applying arc signature pattern recognition processes can include, at step 70, applying one or more matched filters to the time-segmented, filtered off-harmonic frequency bands of the cable signal. Each matched filter can comprise a pattern adapted from a known arc signature, which can be determined by laboratory testing of each type of self-regulating heating cable. In one embodiment, a matched filter can be configured to convolute the cable signal with a pattern having a period that is half of the line frequency period, according to the equation $y[t]=\Sigma b_{MATCHED,n}x[t-n*dt]$. Sustained arcs can be synchronous with this matched filter. If a sustained arc is present, the indicator signal resulting from the matched filtering will be a strongly enhanced rectification of the cable signal. The indicator signal includes a matched filter attribute that is the product of convoluting the matched filter pattern with the cable signal. FIG. 11 illustrates a temporal profile of the indicator signal obtained from the signals in the view of FIG. 4. The matched filter attribute for the arcing cable signal 120 is amplified, showing the presence of arcing signatures that fit the matched filter's pattern for the cable used. The matched filter attribute for the baseline cable signal 122 remains comparatively low. FIGS. 12 and 13 illustrate the resulting indicator signals for the frequency bands 80, 82 of the base cable signal and the frequency bands 90, 92 of the arcing cable signal. In other embodiments, another filtering technique, such as wavelet filtering, may be used instead of matched filtering.

Referring again to FIG. 6, the matched filtering results for each frequency band can be used to determine if a sustained arc is present. At step 72, the microcontroller can record the mean and maximum values of indicator signal for each frequency band in each time segment. The values can be used to derive a historical median mean and a historical median peak for the indicator signal across all frequency bands. The historical values can be derived using the baseline cable signal that is collected from the heating cable 12 in the field, or using laboratory-obtained values for the particular type of heating cable 12. At step 74, the matched filter attribute can be compared to the derived historical median values. As an arcing signature, the amount of time within each time segment the indicator signal exceeds the median or the historic signal maxima can be used as a second indicator signal in one embodiment. In another embodiment, the integrated difference between the measured signal and the historical baseline over time periods where arcing has been determined is used as a second indicator signal. If the second indicator signal is greater than a predetermined threshold in a predetermined number of frequency bands, at step 56, the microcontroller can send an alert, break the circuit, or both.

The described sustained arc detection system can be configured to detect other arcing phenomenon in the monitored electrical system. In one embodiment, the system can detect a ground fault according to one or more of the described detection methods or a subset thereof. For example, a matched filter corresponding to a known ground fault signature can be applied to the time-segmented, filtered off-harmonic frequency bands of the cable signal. In another example, the ground fault signature can be visible without need for matched filtering, and can be detected as described above.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A method of detecting a sustained arc in an electric heat tracing system, the method comprising:
collecting over a predetermined time period a cable signal by sampling the cable signal in a time domain;
extracting, from the sampling of the cable signal, spectral information comprising a frequency component and an amplitude component;
removing a line frequency signature from the spectral information, the line frequency signature comprising a line current frequency of the electric heat tracing system and at least one harmonic of the line current frequency;
extracting at least one off-harmonic frequency band from the spectral information, each off-harmonic frequency band excluding the line current frequency and any harmonic of the line current frequency; and
analyzing the at least one off-harmonic frequency band to determine whether an arc signal is present.

2. The method of claim 1 wherein removing the line frequency signature comprises:
tracking an input signal that contains the line frequency signature;
extracting the line current frequency from the input signal as the input signal is tracked; and
using the line current frequency to remove the line frequency signature from the spectral information.

3. The method of claim 2 wherein extracting the line current frequency from the input signal comprises applying an adaptive notch filter to the input signal.

4. The method of claim 1 wherein extracting the at least one off-harmonic frequency band comprises applying at least one bandpass filter to the spectral information, the at least one bandpass filter comprising a pass-band that does not include the line current frequency and does not include any of the harmonics of the line current frequency.

5. The method of claim 1 wherein extracting the at least one off-harmonic frequency band comprises dividing the at least one off-harmonic frequency band into at least one time segment.

6. The method of claim 5 wherein the at least one time segment is between 0.5 and 3 seconds.

7. The method of claim 1 wherein analyzing the at least one off-harmonic frequency band to determine whether an arc signal is present comprises:
applying a matched filter to the at least one off-harmonic frequency band to obtain an indicator signal; and
determining if the indicator signal exceeds a threshold that indicates whether the sustained arc is present.

8. The method of claim 7 wherein the matched filter comprises a pattern adapted from a known arc signature, the pattern being determined by laboratory testing of a type of heating cable.

9. The method of claim 7 wherein analyzing the at least one off-harmonic frequency band to determine whether an arc signal is present further comprises deriving at least one historical value for the spectral information, and wherein determining if the indicator signal exceeds a threshold comprises determining how long the indicator signal exceeds the at least one historical value.

10. The method of claim 7 wherein analyzing the at least one off-harmonic frequency band to determine whether an arc signal is present further comprises deriving at least one historical value for the spectral information, and wherein determining if the indicator signal exceeds a threshold comprises determining by how much the indicator signal exceeds the at least one historical value.

11. A method of detecting a sustained arc in an electric heat tracing system, the method comprising:
collecting over a predetermined time period a cable signal by sampling the cable signal in a time domain;
extracting, from the sampling of the cable signal, spectral information comprising a frequency component and an amplitude component;
removing a line frequency signature from the spectral information, the line frequency signature comprising a measured line frequency and each harmonic of the measured line frequency that occurs below a highest frequency of interest;
applying to the spectral information a plurality of bandpass filters to obtain a plurality of off-harmonic frequency bands below the highest frequency of interest, wherein a first off-harmonic frequency band of the plurality of off-harmonic frequency bands is between and exclusive of the measured line frequency and a first harmonic frequency, and a second off-harmonic frequency band of the plurality of off-harmonic frequency bands is between and exclusive of the first harmonic frequency and a second harmonic frequency;
dividing the plurality of off-harmonic frequency bands into a plurality of time segments;

applying to the plurality of time segments a matched filter configured to amplify an arc signature; and determining if the arc signature is present in the plurality of time segments.

12. The method of claim 11 wherein the plurality of time segments are each between about 0.5 and 3 seconds long.

13. The method of claim 11 wherein applying the matched filter to the plurality of time segments produces an indicator signal, and wherein determining if the arc signature is present in the plurality of time segments comprises determining if the indicator exceeds at least one historical value of the amplitude component of the spectral information.

14. The method of claim 13 wherein determining if the arc signature is present in the plurality of time segments further comprises determining for how long the indicator exceeds the at least one historical value.

15. The method of claim 11 further comprising:

tracking an input signal that contains the line frequency signature; and extracting the measured line frequency from the input signal.

16. The method of claim 15 wherein extracting the measured line frequency from the input signal comprises applying an adaptive notch filter to the input signal.

17. A method of detecting a sustained arc in an electric heat tracing system, the method comprising:

collecting over a predetermined time period a cable signal;

extracting spectral information from the cable signal, the spectral information comprising a frequency component and an amplitude component;

tracking an input signal that contains a line frequency signature comprising a measured line frequency and each harmnonic of the measured line frequency that occurs below a highest frequency of interest;

extracting the measured line frequency from the input signal as the input signal is tracked;

removing the line frequency signature from the spectral information;

applying to the spectral information a plurality of bandpass filters to obtain a plurality of off-harmonic frequency bands below the highest frequency of interest, wherein a first off-harmonic frequency band of the plurality of off-harmonic frequency bands is between and exclusive of the measured line frequency and a first harmonic frequency, and a second off-harmnonic frequency band of the plurality of off-harmnonic frequency bands is between and exclusive of the first harmonic frequency and a second harmonic frequency;

dividing the plurality of off-harmonic frequency bands into a plurality of time segments;

applying to the plurality of time segments a matched filter configured to amplify an arc signature to obtain an indicator signal; and determining if the indicator signal exceeds a threshold that indicates whether the sustained arc is present.

18. The method of claim 17 further comprising deriving at least one historical value for the spectral information, and wherein determining if the indicator signal exceeds a threshold comprises determining how long the indicator signal exceeds the at least one historical value.

19. The method of claim 17 further comprising deriving at least one historical value for the spectral information, and wherein determining if the indicator signal exceeds a threshold comprises determining by how much the indicator signal exceeds the at least one historical value.

* * * * *